(12) United States Patent
Lee

(10) Patent No.: US 10,418,983 B1
(45) Date of Patent: Sep. 17, 2019

(54) DUTY CYCLE CORRECTION CIRCUIT

(71) Applicant: SK hynix Inc., Incheon-si, Gyeonggi-do (KR)

(72) Inventor: Hyun Bae Lee, Incheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/113,940

(22) Filed: Aug. 27, 2018

(30) Foreign Application Priority Data

Mar. 12, 2018 (KR) .................. 10-2018-0028472

(51) Int. Cl.
*H03K 5/156* (2006.01)
*H03K 3/017* (2006.01)

(52) U.S. Cl.
CPC .......... *H03K 5/1565* (2013.01); *H03K 3/017* (2013.01)

(58) Field of Classification Search
None
See application file for complete search history.

(56) References Cited

U.S. PATENT DOCUMENTS

| | | | | |
|---|---|---|---|---|
| 7,388,415 B2* | 6/2008 | Lee | ........................... | H03L 7/07 327/156 |
| 7,489,171 B2* | 2/2009 | Song | ..................... | H03L 7/0812 327/158 |
| 7,528,639 B2* | 5/2009 | Choi | ..................... | H03L 7/0812 327/147 |
| 7,821,317 B2* | 10/2010 | Jang | ......................... | G06F 1/08 327/158 |
| 8,390,351 B2* | 3/2013 | Choi | ..................... | G11C 7/222 327/149 |
| 8,502,580 B2* | 8/2013 | Kim | ..................... | H03L 7/0816 327/156 |
| 9,484,931 B2* | 11/2016 | Im | ............................. | H03L 7/08 |

FOREIGN PATENT DOCUMENTS

KR 1020160065516 A 6/2016

* cited by examiner

*Primary Examiner* — Jeffery S Zweizig
(74) *Attorney, Agent, or Firm* — William Park & Associates Ltd.

(57) ABSTRACT

A duty cycle correction circuit is provided. The duty cycle correction circuit may include a correction circuit configured to correct a duty cycle of an external clock signal according to a locking signal. The duty cycle correction circuit may include a locking signal detection circuit configured to generate the locking signal for correcting the duty cycle of the external clock signal, using an internal clock signal generated in a semiconductor circuit.

20 Claims, 14 Drawing Sheets

DUTY CYCLE CORRECTION CIRCUIT

CROSS-REFERENCES TO RELATED APPLICATION

The present application claims priority under 35 U.S.C. § 119(a) to Korean application number 10-2018-0028472, filed on Mar. 12, 2018, in the Korean Intellectual Property Office, which is incorporated herein by reference in its entirety.

BACKGROUND

1. Technical Field

Various embodiments generally relate to a semiconductor circuit, and more particularly, to a duty cycle correction circuit.

2. Related Art

For a semiconductor circuit such as a CPU or memory, which is operates based on a clock signal, it is very important to accurately control the duty of the clock signal.

For example, when the duty of the clock signal does not coincide with 50% or the ratio of high level sections in the clock signal is not equal to the ratio of low level sections, data may not be inputted and outputted with accurate timing.

Therefore, the semiconductor circuit operating based on the clock signal requires a duty cycle correction circuit for correcting the duty of the clock signal.

At this time, the conventional duty cycle correction circuit is configured to correct a difference in duty cycle between differential dock signals.

Since any one of the differential clock signals has the opposite phase to that of the other one, it is easy to correct the duty cycle.

When a single-phase clock signal is used, it is more advantageous in terms of power consumption of the semiconductor circuit than when the differential clock signals are used.

However, the single-phase clock signal provides only one phase and does not provide the opposite phase. Therefore, since the single-phase clock signal has a limitation in correcting the duty cycle, there are difficulties in using the single-phase clock signal.

SUMMARY

In an embodiment, a duty cycle correction circuit may be provided. The duty cycle correction circuit may include a correction circuit configured to correct a duty cycle of an external clock signal according to a locking signal. The duty cycle correction circuit may include a locking signal detection circuit configured to generate the locking signal for correcting the duty cycle of the external clock signal, using an internal clock signal generated in a semiconductor circuit.

DETAILED DESCRIPTION

Hereinafter, a duty cycle correction circuit according to the present disclosure will be described below with reference to the accompanying drawings through examples of embodiments.

Various embodiments may be directed to a duty cycle correction circuit capable of correcting the duty cycle of a single-phase clock signal.

Figure 1:
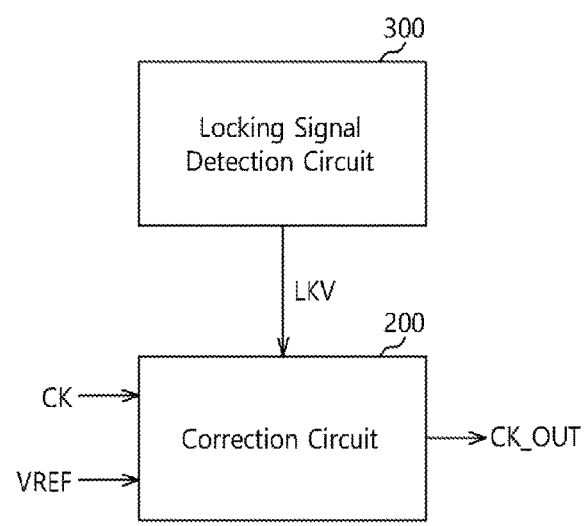
FIG. 1 illustrates the configuration of a duty cycle correction circuit in accordance with an embodiment.

FIG. 1 illustrates the configuration of a duty cycle correction circuit 100 in accordance with an embodiment.

The duty cycle correction circuit 100 in accordance with a present embodiment may generate an analog locking signal which serves as a reference signal for determining whether the duty cycle of an external clock signal CK is locked. The duty cycle correction circuit 100 may perform duty cycle correction according to the analog locking signal.

Referring to FIG. 1, the duty cycle correction circuit 100 in accordance with a present embodiment may include a correction circuit 200 and a locking signal detection circuit 300.

The correction circuit 200 may correct the duty cycle of an external clock signal CK according to a locking signal LKV.

The locking signal detection circuit 300 may generate the locking signal LKV for correcting the duty cycle of the external clock signal CK, using an internal clock signal which is generated in a semiconductor circuit.

The external clock signal CK may be provided from outside the semiconductor circuit including the duty cycle correction circuit 100 in accordance with a present embodiment, and may include a single-phase clock signal.

For example, when the semiconductor circuit acts as memory, the external clock signal CK may be provided from a processor such as a CPU or GPU. In some embodiments, the correction circuit 200 may receive the external clock signal CK according to a reference voltage VREF. The correction circuit 201 may output a clock signal CK_OUT.

Figure 2:
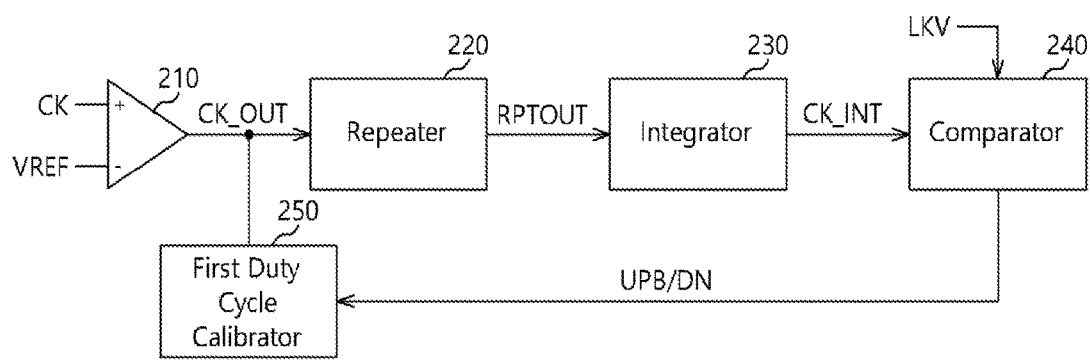
FIG. 2 illustrates the configuration of a correction circuit of FIG. 1.

FIG. 2 illustrates the configuration of the correction circuit 200 of FIG. 1.

Referring to FIG. 2, the correction circuit 200 may include a receiver 210, a repeater 220, an integrator 230, a duty cycle comparator 240 and a first duty cycle calibrator 250.

The receiver 210 may receive the external dock signal CK according to a reference voltage VREF.

The repeater 220 may retransmit a clock signal CK_OUT received through the receiver 210 to predetermined circuit components in the semiconductor circuit.

The integrator 230 may integrate an output RPTOUT of the repeater 220, and output the integration result.

The duty cycle comparator 240 may generate differential comparison signals UPB/DN by comparing the locking signal LKV provided from the locking signal detection circuit 300 to the output CK_INT of the integrator 230.

The first duty cycle calibrator 250 may calibrate the duty cycle of the external clock signal CK, i.e. the duty cycle of the output signal CK_OUT of the receiver 210, according to the differential comparison signals UPB/DN.

Figure 3:
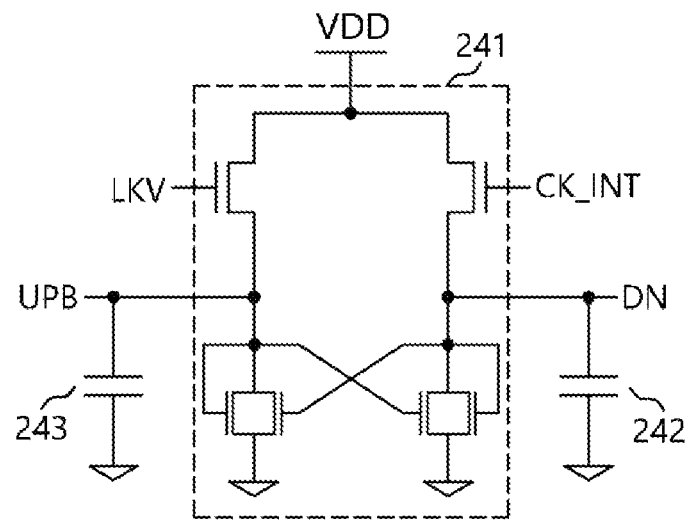
FIG. 3 illustrates the configuration of a duty cycle comparator of FIG. 2.

FIG. 3 illustrates the configuration of the duty cycle comparator 240 of FIG. 2.

Referring to FIG. 3, the duty cycle comparator 240 may include a differential amplifier 241, a first capacitor 242 and a second capacitor 243.

The differential amplifier 241 may receive the locking signal LKV through a first input terminal thereof, receive the output CK_INT of the integrator 230 through a second input terminal thereof, and output the amplified differential comparison signals UPB/DN through first and second output terminals thereof. The differential amplifier 241 may also receive a power supply VDD voltage.

The first capacitor 242 may be coupled to the first output terminal, and the second capacitor 243 may be coupled to the second output terminal.

While the charge amounts of the first and second capacitors 242 and 243 are changed depending on a level difference between the locking signal LKV and the output CK_INT of the integrator 230, the levels of the differential comparison signals UPB/DN may be calibrated.

Figure 4:
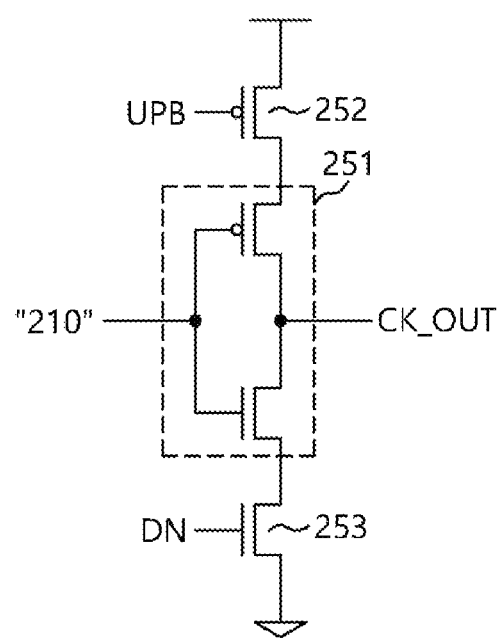
FIG. 4 illustrates the configuration of a first duty cycle calibrator of FIG. 2.

FIG. 4 illustrates the configuration of the first duty cycle calibrator 250 of FIG. 2.

Referring to FIG. 4, the first duty cycle calibrator 250 may include an inverter 251, a pull-up element 252 and a pull-down element 253.

The inverter 251 may have an input terminal coupled to the receiver 210.

The pull-up element 252 may be coupled between a power supply terminal and the inverter 251, and pull up an output node of the inverter 251 according to the differential comparison signal UPB of the differential comparison signals UPB/DN.

The pull-down element 253 may be coupled between a ground terminal and the inverter 251, and pull down the output node of the inverter 251 according to the differential comparison signal DN of the differential comparison signals UPB/DN.

Figure 5:
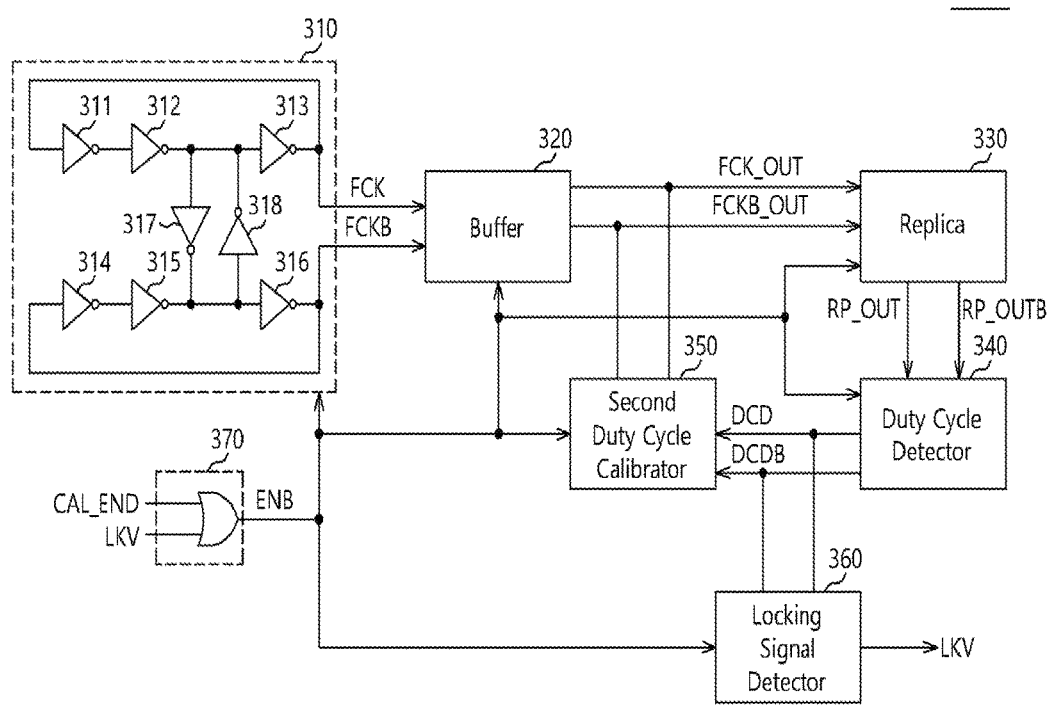
FIG. 5 illustrates the configuration of a locking signal detection circuit of FIG. 1.

FIG. 5 illustrates the configuration of the locking signal detection circuit 300 of FIG. 1.

Referring to FIG. 5, the locking signal detection circuit 300 may include an oscillator 310, a buffer 320, a replica 330, a duty cycle detector 340, a second duty cycle calibrator 350, a locking signal detector 360 and an enable control circuit 370.

The oscillator 310 may generate internal differential clock signals FCK and FCKB.

The oscillator 310 may include a plurality of inverters 311 to 318.

The buffer 320 may generate output signals FCK_OUT and FCKB_OUT by buffering the internal differential clock signals FCK and FCKB.

The replica 330, which is a replica circuit of the repeater 220 of FIG. 2, may delay the output signals FCK_OUT and FCKB_OUT of the buffer 320 by the same delay time as the signal processing delay time of the repeater 220, and output the delayed signals.

The replica 330 may control the internal differential clock signals FCK and FCKB to have the same process, voltage, and temperature (PVT) characteristic as the external clock signal CK, a delay characteristic caused by a PVT variation.

The duty cycle detector 340 may generate differential duty detection signals DCD and DCDB by detecting a duty difference between the differential output signals RP_OUT and RP_OUTB of the replica 330.

The second duty cycle calibrator 350 may calibrate the duty cycles of the internal differential clock signals FCK and FCKB, i.e. the output signals FCK_OUT and FCKB_OUT of the buffer 320, according to the differential duty detection signals DCD and DCDB.

The locking signal detector 360 may output the level at which the duty locking of the internal differential clock signals FCK and FCKB is completed, i.e. the analog level of the differential duty detection signal DCD when the levels of the differential duty detection signals DCD and DCDB are equalized to each other while the differential duty detection signals CDC and DCDB have the same duty ratio (high duty and low duty are equal to each other), as the locking signal LKV.

The locking signal detection circuit 300, i.e. the oscillator 310, the buffer 320, the replica 330, the duty cycle detector 340 the second duty cycle calibrator 350 and the locking signal detector 360 may be enabled or disabled according to the enable signal ENB.

For example, the oscillator 310, the buffer 320, the replica 330, the duty cycle detector 340, the second duty cycle calibrator 350 and the locking signal detector 360 may be enabled while the enable signal ENB is activated at a low level, and disabled while the enable signal ENB is deactivated at a high level.

The locking signal detection circuit 300 may be enabled only during a duty calibration period (until duty locking is completed after duty calibration is started) and disabled during the subsequent period, which makes it possible to reduce current consumption.

The enable control circuit 370 may generate the enable signal ENB for enabling the locking signal detection circuit 300 only during the duty calibration period (until the duty locking is completed after the duty calibration is started), and disabling the locking signal detection circuit 300 after the duty locking operation is completed.

The enable control circuit 370 may generate the enable signal ENB according to a calibration end signal CAL_END and the locking signal LKV.

The calibration end signal CAL_END may be generated according to a duty calibration command. The calibration end signal CAL_END may be activated to a high level at an end point of the duty calibration period, which is set by the duty calibration command.

The enable control circuit 370 may perform an OR operation on the calibration end signal CAL_END and the locking signal LKV, and output the operation result as the enable signal ENB.

When any one of the calibration end signal CAL_END and the locking signal LKV is activated at a high level, or when the duty calibration period is ended or the duty locking is completed within the duty calibration period, the enable control circuit 370 may deactivate the enable signal ENB to a high level.

Figure 6:
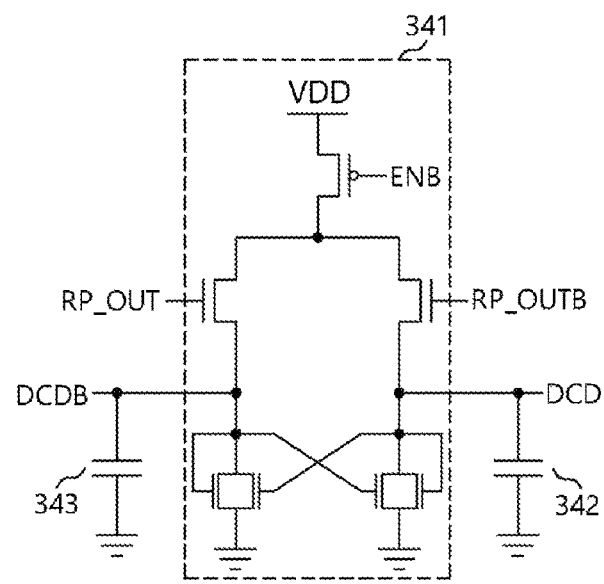
FIG. 6 illustrates the configuration of a duty cycle detector of FIG. 5.

FIG. 6 illustrates the configuration of the duty cycle detector 340 of FIG. 5.

Referring to FIG. 6, the duty cycle detector 340 may include a differential amplifier 341, a first capacitor 342 and a second capacitor 343.

The differential amplifier 341 may receive the differential output signals RP_OUT and RP_OUTB of the replica 330, and output the amplified differential duty detection signals DCD and DCDB.

The first and second capacitors 342 and 343 may calibrate the levels of the differential duty detection signals DCD and DCDB, while the charge amounts of the first and second capacitors 342 and 343 are changed according to a level difference between the differential output signals RP_OUT and RP_OUTB. The differential amplifier 341 may also receive the enable signal ENB and a power supply VDD voltage.

Figure 7:
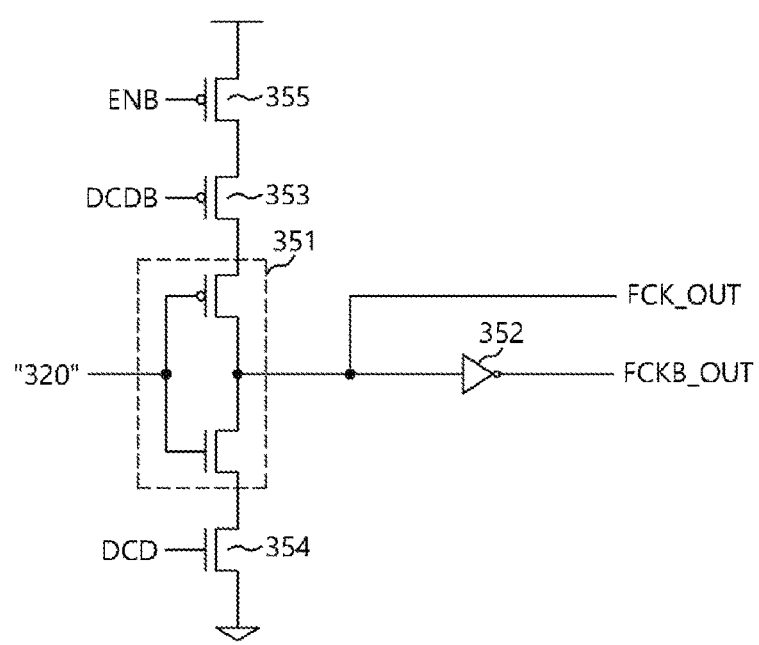
FIG. 7 illustrates the configuration of a second duty cycle calibrator of FIG. 5.

FIG. 7 illustrates the configuration of the second duty cycle calibrator 350 of FIG. 5.

Referring to FIG. 7, the second duty cycle calibrator 350 may include a first inverter 351, a second inverter 352, a pull-up element 353, a pull-down element 354 and a switching element 355.

The first inverter 351 may have an input terminal coupled to the buffer 320.

The second inverter 352 may receive an output of the first inverter 351.

The pull-up element 353 may be coupled between the switching element 355 and the first inverter 351, and pull up an output node of the first inverter 351 according to the differential duty detection signal DCDB of the differential duty detection signals DCD and DCDB.

The pull-down element 354 may be coupled between the ground terminal and the first inverter 351, and pull down the output node of the first inverter 351 according to the differential duty detection signal DCD of the differential duty detection signals DCD and DCDB.

The switching element 355 may couple the power supply terminal to the pull-up element 353 when the enable signal ENB is activated to a low level.

Figure 8:
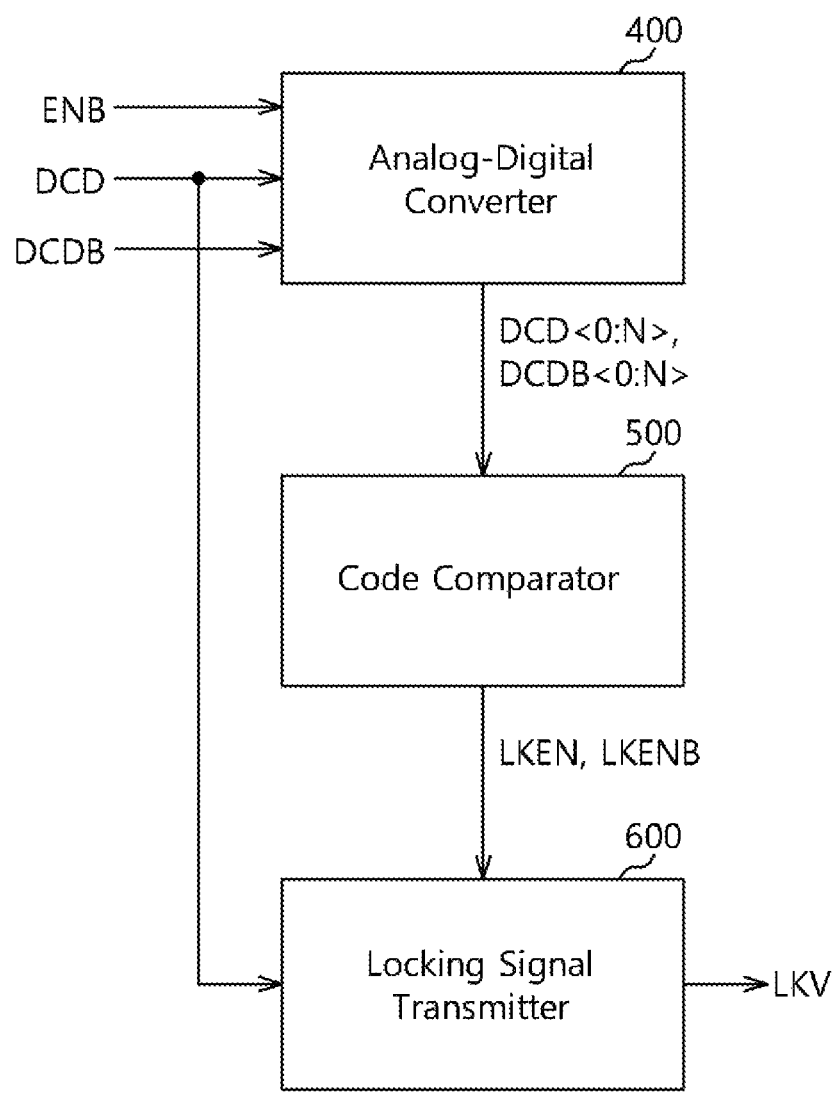
FIG. 8 illustrates the configuration of a locking signal detector of FIG. 5.

FIG. 8 illustrates the configuration of the locking signal detector 360 of FIG. 5.

Referring to FIG. 8, the locking signal detector 360 may include an analog-digital converter 400, a code comparator 500 and a locking signal transmitter 600.

When the enable signal ENB is activated, the analog-digital converter 400 may generate differential duty detection codes DCD<0:N> and DCDB<0:N> by converting the analog differential duty detection signals DCD and DCDB into digital signals.

The code comparator 500 may activate transmission enable signals LKEN and LKENB, when the values of the differential duty detection codes DCD<0:N> and DCDB<0:N> coincide with each other or the bit values of the differential duty detection code DCD<0:N> coincide with the bit values of the differential duty detection code DCDB<0:N>.

The locking signal transmitter 600 may output the differential duty detection signal DCD of the differential duty detection signals DCD and DCDB as the locking signal LKV, when the transmission enable signals LKEN and LKENB are activated.

Figure 9:
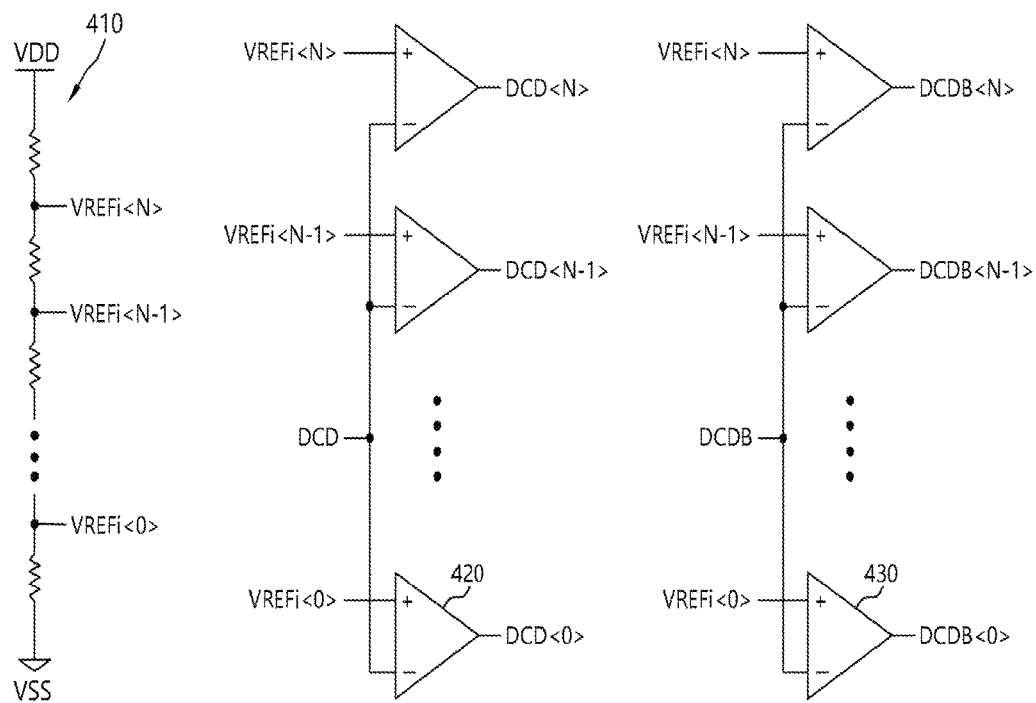
FIG. 9 illustrates the configuration of an analog-digital converter of FIG. 8.

FIG. 9 illustrates the configuration of the analog-digital converter 400 of FIG. 8.

As illustrated in FIG. 9, the analog-digital converter 400 may include a divider resistor 410, a plurality of first comparators 420 and a plurality of second comparators 430.

The divider resistor 410 may include a plurality of resistors coupled between the power supply VDD terminal and the ground VSS terminal.

The divider resistor 410 may divide a voltage level between the power supply VDD terminal and the ground VSS terminal through the plurality of resistors, and generate a plurality of reference voltages VREFi<0:N> through a plurality of taps.

The plurality of first comparators 420 may generate the differential duty detection code DCD<0:N> of the differential duty detection codes DCD<0:N> and DCDB<0:N> by comparing the differential duty detection signal DCD of the differential duty detection signals DCD and DCDB to the respective reference voltages VREFi<0:N>.

The plurality of second comparators 430 may generate the differential duty detection code DCDB<0:N> of the differential duty detection codes DCD<0:N> and DCDB<0:N> by comparing the differential duty detection signal DCDB of the differential duty detection signals DCD and DCDB to the respective reference voltages VREFi<0:N>.

Figure 10:
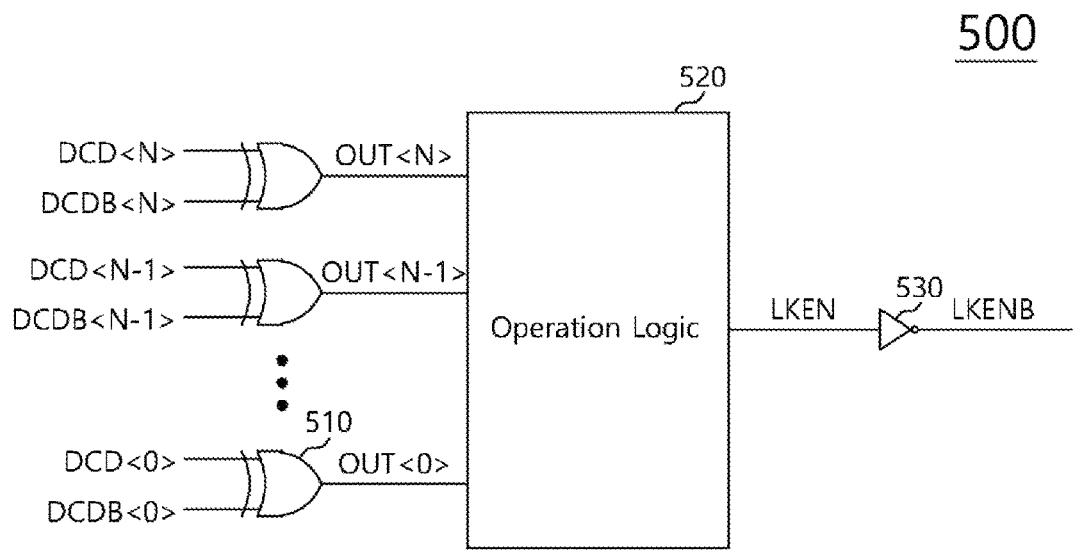
FIG. 10 illustrates the configuration of a code comparator of FIG. 8.

FIG. 10 illustrates the configuration of the code comparator 500 of FIG. 8.

As illustrated in FIG. 10, the code comparator 500 may include a plurality of logic gates 510, an operation logic 520, and an inverter 530.

The plurality of logic gates 510 may receive the differential duty detection codes DCD<0:N> and DCDB<0:N> by a pair of bits in the same order, and generate output signals OUT<0:N> by performing an XOR operation on the received signals.

For example, the logic gate 510 for outputting the output signal OUT<0> may output a low level when the differential duty detection codes DCD<0> and DCDB<0> have the same value.

The operation logic 520 may generate the transmission enable signal LKEN by performing a NAND operation on the output signals OUT<0:N>.

The operation logic 520 may activate the transmission enable signal LKEN to a high level, when the bits of the output signals OUT<0:N> are all at a low level.

The inverter 530 may invert the transmission enable signal LKEN, and output the inverted transmission enable signal LKENB.

Figure 11:
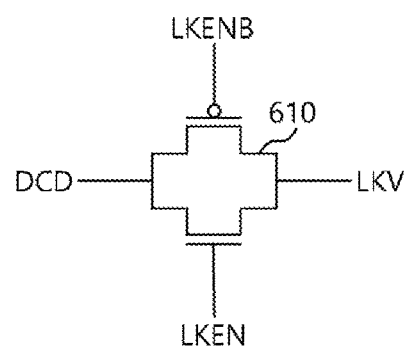
FIG. 11 illustrates the configuration of a locking signal transmitter of FIG. 8.

FIG. 11 illustrates the configuration of the locking signal transmitter 600 of FIG. 8.

As illustrated in FIG. 11, the locking signal transmitter 600 may include a pass gate 610.

The pass gate 610 may receive the differential duty detection signal DCD of the differential duty detection signals DCD and DCDB through an input terminal thereof, and receive the transmission enable signal LKEN and the inverted transmission enable signal LKENB through control terminals thereof.

The pass gate 610 may output the differential duty detection signal DCD as the locking signal LKV when the transmission enable signal LKEN is at a high level (LKENB=low level).

Hereafter, the operation of the duty cycle correction circuit 100 in accordance with a present embodiment will be described as follows.

As the duty calibration command is generated outside or inside the semiconductor apparatus, the duty calibration operation may be started.

The calibration end signal CAL_END may be deactivated during the duty calibration period, and the locking signal LKV may also be deactivated until the duty locking operation is completed.

Since the calibration end signal CAL_END and the locking signal LKV are deactivated, the locking signal detection circuit 300 may repeat the operation of detecting and calibrating the duty cycles of the internal differential clock signals FCK and FCKB, and generate the locking signal LKV indicating that the duties of the internal differential clock signals FCK and FCKB are calibrated to 50% at which a high period and a low period coincide with each other.

The internal differential clock signals FCK and FCKB are free running clock signals generated through the oscillator 310. Therefore, while the internal differential clock signals FCK and FCKB are controlled to pass through the same signal path as the external clock signal CK, i.e. the buffer 320 and the replica 330, the internal differential clock signals FCK and FCKB may have the same duty cycle characteristic as the external clock signal CK.

Therefore, the locking signal LKV serving as a reference signal for calibrating the duty of the external clock signal CK to a desired value may be generated through the locking signal detection circuit 300.

As the locking signal LKV is generated, the locking signal detection circuit 300 may be disabled. That is, the operation of the locking signal detection circuit 300 may be stopped.

The correction circuit 200 may repeatedly calibrate the duty cycle of the external clock signal CK, such that a signal obtained by integrating the external clock signal CK, i.e. the output signal CK_INT of the integrator 230 has the same level as the locking signal LKV.

As the output signal CK_INT of the integrator 230 has the same level as the locking signal LKV, the duty cycle calibration of the external clock signal CK may be finally completed.

As described above, the duty cycle correction circuit in accordance with a present embodiment may generate the locking signal LKV serving as a reference signal for calibrating the duty of the external clock signal CK to a desired value, using the internal differential clock signals FCK and FCKB which are generated in the semiconductor apparatus, and calibrate the duty of the external clock signal CK using the locking signal LKV.

That is, even when the clock signal provided from outside the semiconductor apparatus is not a differential clock signal but a single-phase clock signal, the duty cycle correction circuit can perform the duty cycle calibration with precision.

Figure 12:
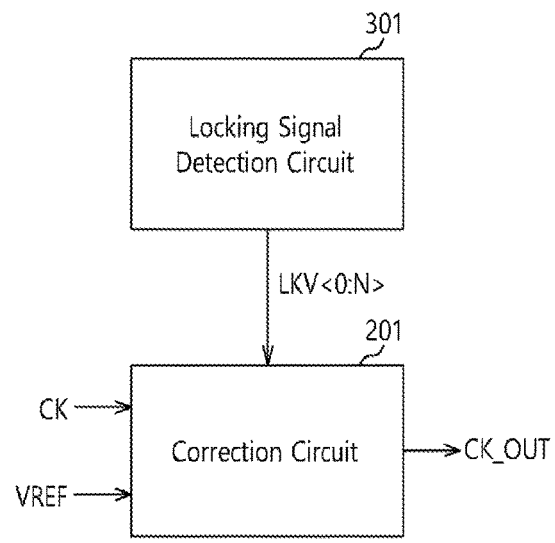
FIG. 12 illustrates the configuration of a duty cycle correction circuit in accordance with an embodiment.

FIG. 12 illustrates the configuration of a duty cycle correction circuit 101 in accordance with other embodiments.

The duty cycle correction circuit 101 in accordance with a present embodiment may generate a locking code LKV<0:N> which is not an analog locking signal but a digital locking signal, and perform duty cycle correction according to the locking code LKV<0:N>.

Referring to FIG. 12, the duty cycle correction circuit 101 in accordance with a present embodiment may include a correction circuit 201 and a locking signal detection circuit 301.

The correction circuit 201 may correct the duty cycle of the external clock signal CK according to the locking code LKV<0:N>.

The locking signal detection circuit 301 may generate the locking code LKV<0:N> for correcting the duty cycle of the external clock signal CK, using an internal clock signal which is generated in a semiconductor circuit.

The external clock signal CK may be provided from outside the semiconductor circuit including the duty cycle correction circuit 101 in accordance with a present embodiment, and may include a single-phase clock signal.

For example, when the semiconductor circuit acts as memory, the external clock signal CK may be provided from a processor such as a CPU or GPU. In some embodiments, the correction circuit 201 may receive the external clock signal CK according to a reference voltage VREF. The correction circuit 201 may output a clock signal CK_OUT.

Figure 13:
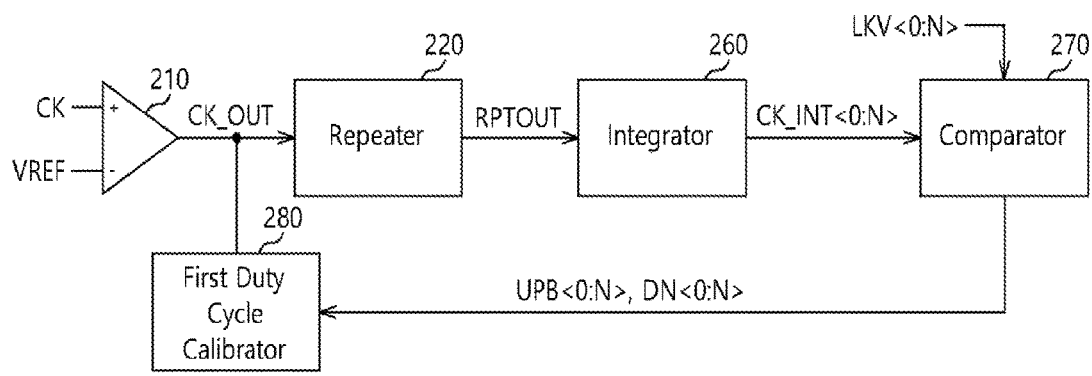
FIG. 13 illustrates the configuration of a correction circuit of FIG. 12.

FIG. 13 illustrates the configuration of the correction circuit 201 of FIG. 12.

Referring to FIG. 13, the correction circuit 201 may include a receiver 210, a repeater 220, an integrator 260, a comparator 270 and a first duty cycle calibrator 280.

Since the receiver 210 and the repeater 220 have the same configuration as those of FIG. 2, the detailed descriptions thereof are omitted herein.

The integrator 260 implemented with a digital integrator may integrate an output RPTOUT of the repeater 220, and output a digital signal CK_INT<0:N>.

The comparator 270 implemented with a digital comparator may generate differential comparison codes UPB<0:N>/DN<0:N> by comparing the locking code LKV<0:N> provided from the locking signal detection circuit 301 to the digital signal CK_INT<0:N> outputted from the integrator 260.

The first duty cycle calibrator 280 may calibrate the duty cycle of the external clock signal CK, i.e. the duty cycle of the output signal CK_OUT of the receiver 210, according to the differential comparison codes UPB<0:N>/DN<0:N>.

Figure 14:
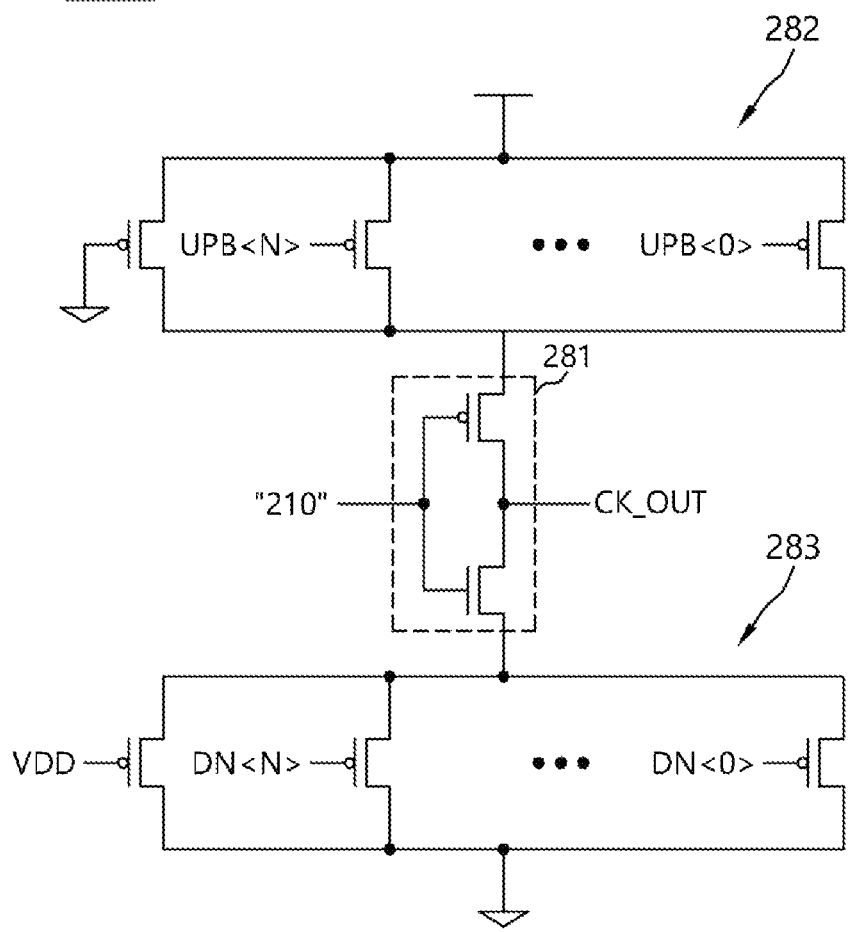
FIG. 14 illustrates the configuration of a first duty cycle calibrator of FIG. 13.

FIG. 14 illustrates the configuration of the first duty cycle calibrator 280 of FIG. 13.

Referring to FIG. 14, the first duty cycle calibrator 280 may include an inverter 281, a plurality of pull-up legs 282 and a plurality of pull-down legs 283.

The inverter 281 may have an input terminal coupled to the receiver 210.

The plurality of pull-up legs 282 may be commonly coupled between the power supply terminal and the inverter 281, and pull up an output node of the inverter 281, using drivability varied through legs which are selectively turned on according to the differential comparison code UPB<0:N> of the differential comparison codes UPB<0:N>/DN<0:N>.

Each of the pull-up legs 282 may include a transistor coupled between the power supply terminal and the inverter 281.

The plurality of pull-down legs 283 may be commonly coupled between the ground terminal and the inverter 281, and pull down the output node of the inverter 281, using drivability varied through legs which are selectively turned on according to the differential comparison code DN<0:N> of the differential comparison codes UPB<0:N>/DN<0:N>.

Figure 15:
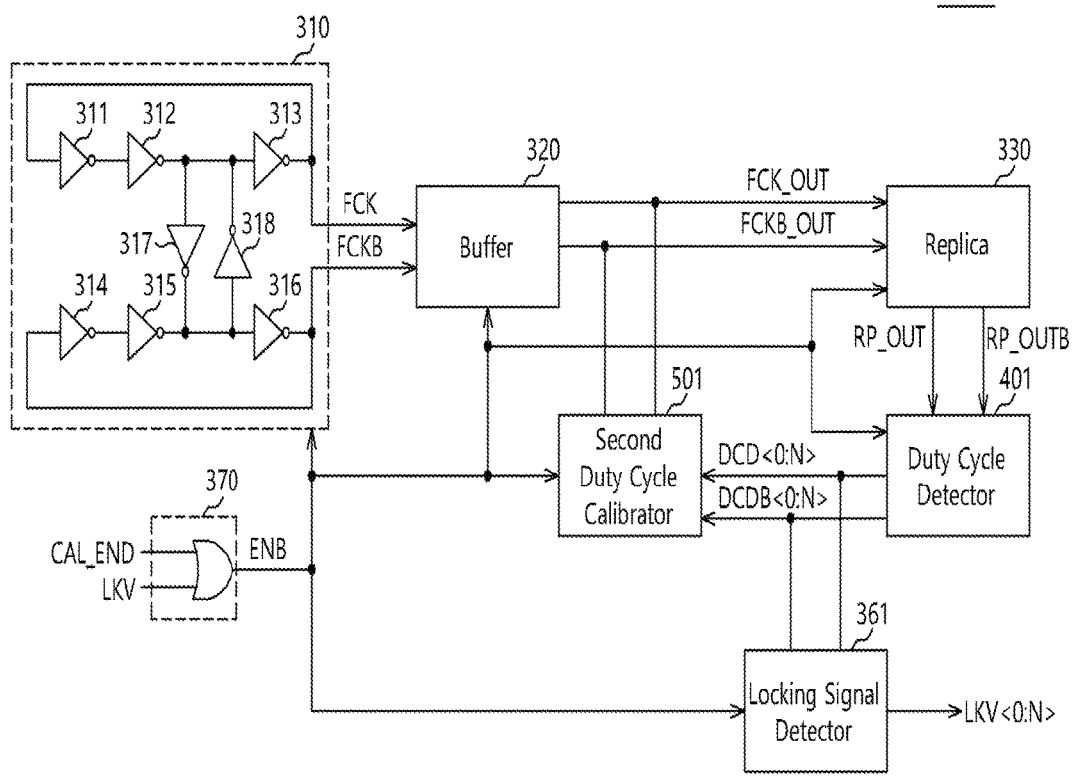
FIG. 15 illustrates the configuration of a locking signal detection circuit of FIG. 12.

FIG. 15 illustrates the configuration of the locking signal detection circuit 301 of FIG. 12.

Referring to FIG. 15, the locking signal detection circuit 301 may include an oscillator 310, a buffer 320, a replica 330, a duty cycle detector 401, a second duty cycle calibrator 501, a locking signal detector 361 and an enable control circuit 370.

Since the oscillator 310, the buffer 320 and the enable control circuit 370 can be configured in the same manner as those of FIG. 5, the detailed descriptions thereof are omitted herein.

The duty cycle detector 401 may generate digital differential duty detection codes DCD<0:N> and DCDB<0:N> by detecting a duty difference between differential output signals RP_OUT and RP_OUTB of the replica 330.

The second duty cycle calibrator 501 may adjust the duty cycles of the internal differential clock signals FCK and FCKB, i.e. the output signals FCK_OUT and FCKB_OUT of the buffer 320, according to the differential duty detection codes DCD<0:N> and DCDB<0:N>.

Since the differential duty detection codes DCD<0:N> and DCDB<0:N> are digital signals having a more stable level than analog signals, the second duty cycle calibrator 501 can also perform a stable duty cycle calibration operation.

The locking signal detector 361 may output the level at which the duty locking of the internal differential clock signals FCK and FCKB is completed, i.e. the level of the differential duty detection signal DCD when the levels of the differential duty detection signals DCD and DCDB are equalized to each other while the differential duty detection signals CDC and DCDB have the same duty ratio (high duty and low duty are equal to each other), as the locking signal LKV<0:N> which is a digital signal.

Figure 16:
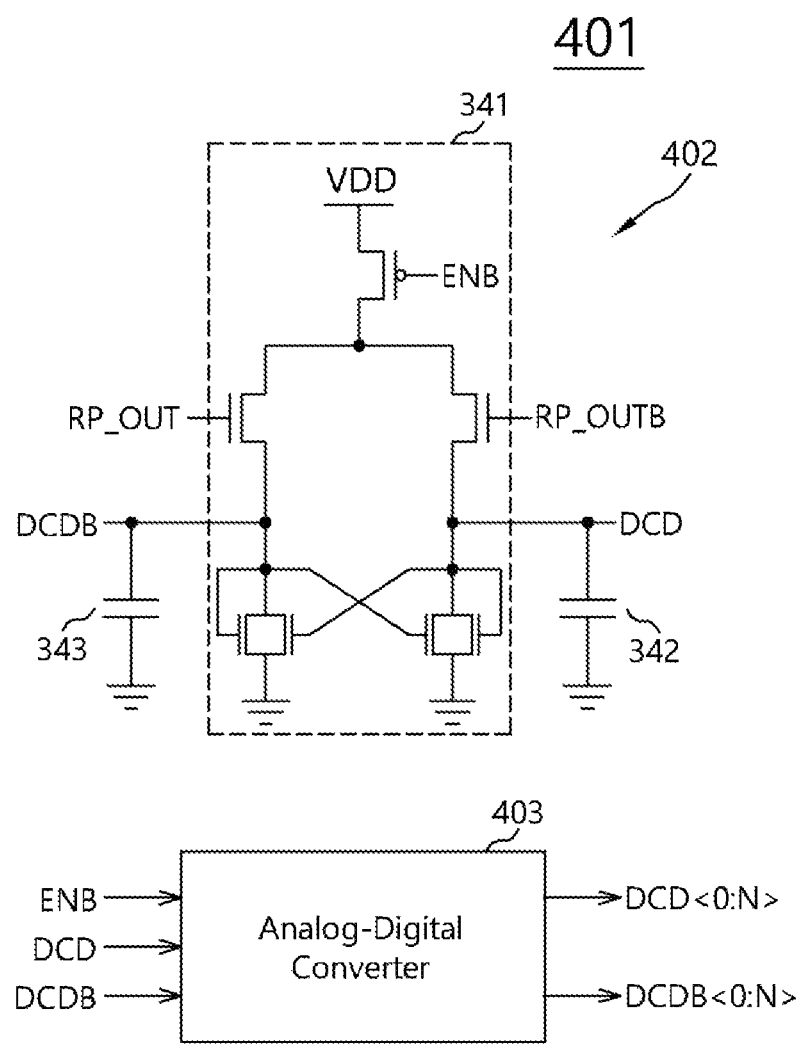
FIG. 16 illustrates the configuration of a duty cycle detector of FIG. 15.

FIG. 16 illustrates the configuration of the duty cycle detector 401 of FIG. 15.

As illustrated in FIG. 16, the duty cycle detector 401 may include an amplifier circuit 402 and an analog-digital converter 403.

The amplifier circuit 402 may include a differential amplifier 341, a first capacitor 342 and a second capacitor 343.

The differential amplifier 341 may receive the differential output signals RP_OUT and RP_OUTB of the replica 330, and output the amplified differential duty detection signals DCD and DCDB.

The first and second capacitors 342 and 343 may calibrate the levels of the differential duty detection signals DCD and DCDB, while the charge amounts of the first and second capacitors 342 and 343 are changed according to a level difference between the differential output signals RP_OUT and RP_OUTB.

When the enable signal ENB is activated, the analog-digital converter 403 may convert the analog differential duty detection signals DCD and DCDB into digital signals, and output the digital signals as the differential duty detection codes DCD<0:N> and DCDB<0:N>.

Figure 17:
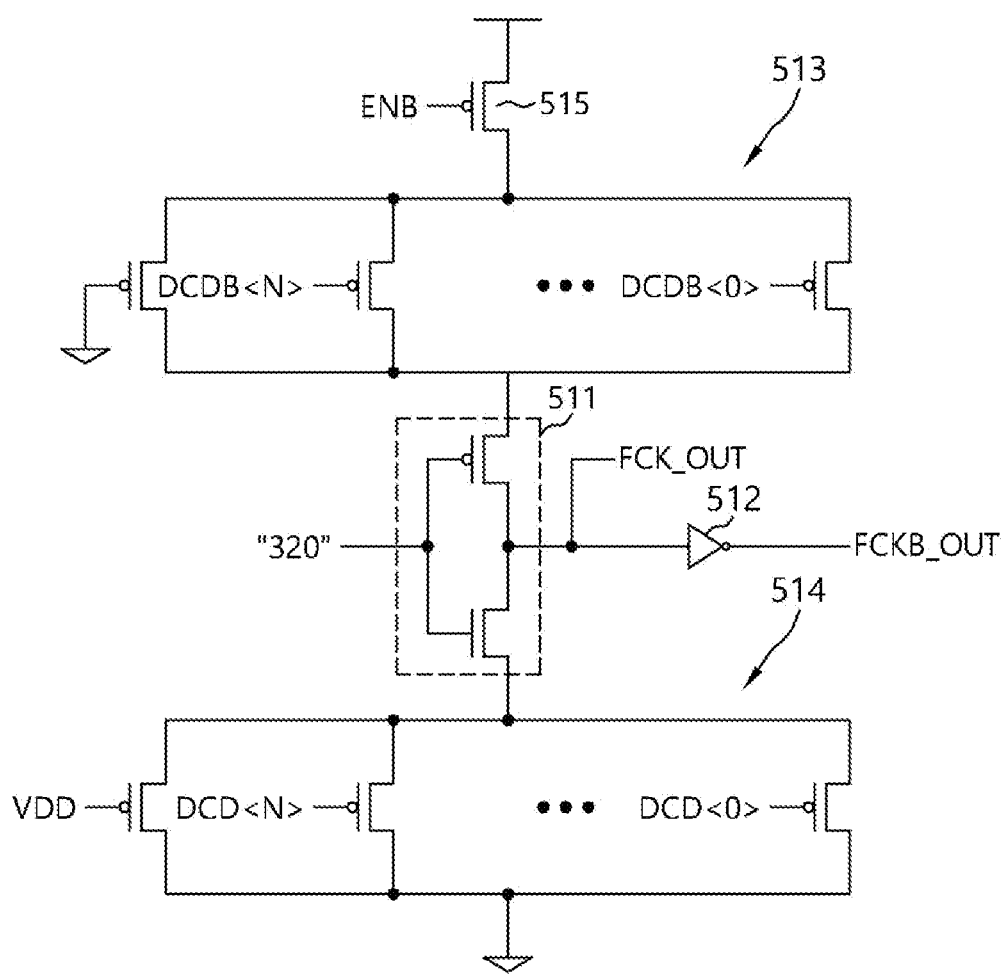
FIG. 17 illustrates the configuration of a second duty cycle calibrator of FIG. 15.

FIG. 17 illustrates the configuration of the second duty cycle calibrator 501 of FIG. 15.

As illustrated in FIG. 17, the second duty cycle calibrator 501 may include a first inverter 511, a second inverter 512, a plurality of pull-up legs 513, a plurality of pull-down legs 514 and a switching element 515.

The first inverter 511 may have an input terminal coupled to the buffer 320.

The second inverter 512 may receive an output of the first inverter 511.

The plurality of pull-up legs 513 may be commonly coupled between the switching element 515 and the first inverter 511, and pull up an output node of the first inverter 511, using drivability varied through legs which are selectively turned on according to the differential duty detection code DCDB<0:N> of the differential duty detection codes DCD<0:N> and DCDB<0:N>.

Each of the pull-up legs 513 may include a transistor coupled between the switching element 515 and the first inverter 511.

The plurality of pull-down legs 514 may be commonly coupled between the ground terminal and the first inverter 511, and pull down the output node of the first inverter 511, using drivability varied through legs which are selectively turned on according to the differential duty detection code DCD<0:N> of the differential duty detection codes DCD<0:N> and DCDB<0:N>.

The switching element 515 may couple the power supply terminal to the plurality of pull-up legs 513 when the enable signal ENB is activated to a low level.

Figure 18:
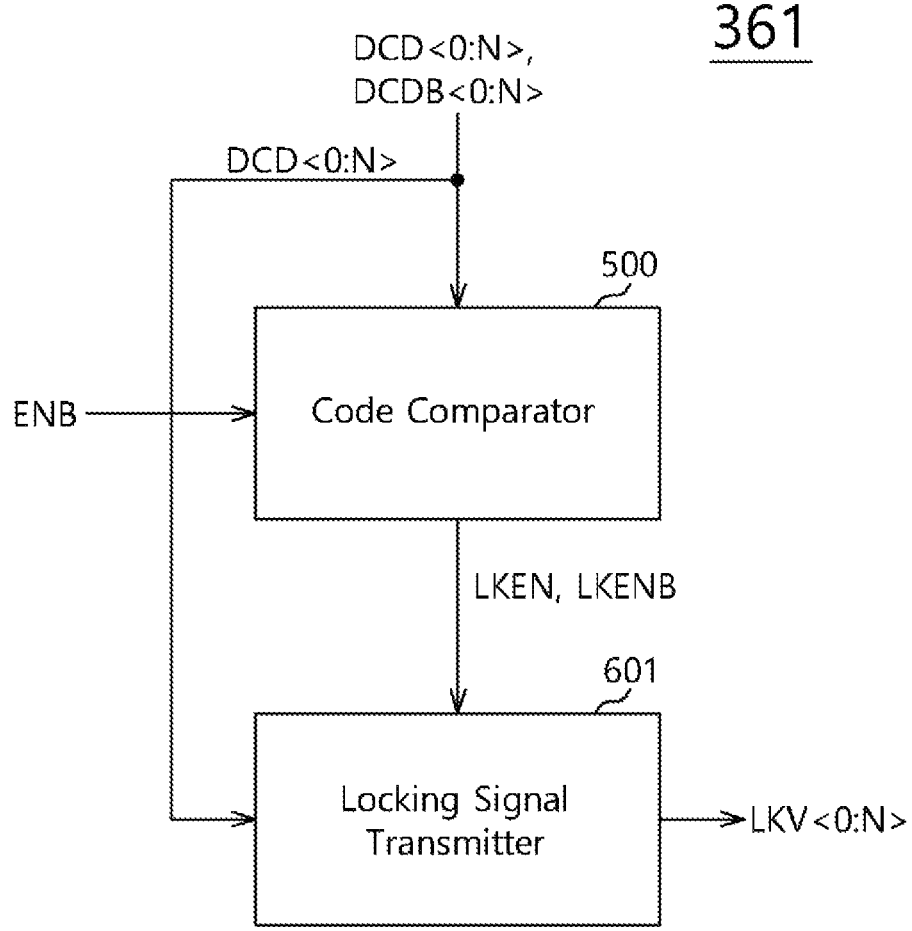
FIG. 18 illustrates the configuration of a locking signal detector of FIG. 15.

FIG. 18 illustrates the configuration of the locking signal detector 361 of FIG. 15.

Referring to FIG. 18, the locking signal detector 361 may include a code comparator 500 and a locking signal transmitter 601.

Since the code comparator 500 can be configured in the same manner as that of FIG. 3 except that the code comparator 500 is enabled according to the enable signal ENB, the detailed descriptions thereof omitted herein.

The locking signal transmitter 601 may output the differential duty detection code DCD<0:N> of the differential duty detection codes DCD<0:N> and DCDB<0:N> as the locking code LKV<0:N>, when the transmission enable signals LKEN and LKENB are activated.

Figure 19:
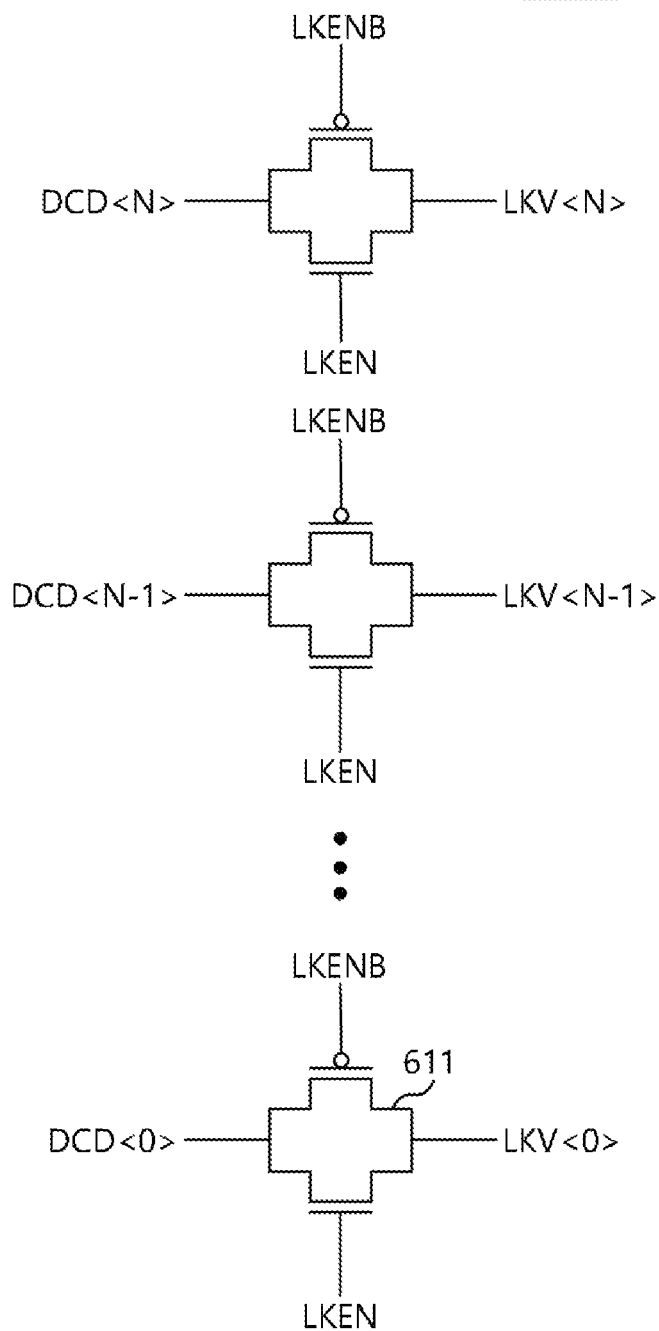
FIG. 19 illustrates the configuration of a locking signal transmitter of FIG. 18.

FIG. 19 illustrates the configuration of the locking signal transmitter 601 of FIG. 18.

Referring to FIG. 19, the locking signal transmitter 601 may include a plurality of pass gates 611.

The plurality of pass gates 611 may receive the differential duty detection code DCD<0:N> of the differential duty detection codes DCD<0:N> and DCDB<0:N> through input terminals thereof, respectively, and receive the transmission enable signal LKEN and the inverted transmission enable signal LKENB through control terminals thereof.

The plurality of pass gates 611 may output the differential duty detection code DCD<0:N> as the locking code LKV<0:N> when the transmission enable signal LKEN is at a high level (LKENB=low level).

Since the operation of the duty cycle correction circuit 101 in accordance with a present embodiment is similar to the operation of the duty cycle correction circuit 100 described with reference to FIGS. 1 to 11 except that the digital signals such as the locking code LKV<0:N> are processed, the detailed descriptions thereof are omitted herein.

While various embodiments have been described above, it will be understood to those skilled in the art that the embodiments described are examples only. Accordingly, the operating method of a data storage device described herein should not be limited based on the described embodiments.

What is claimed is:

1. A duty cycle correction circuit comprising:
a correction circuit configured to correct a duty cycle of an external clock signal according to a locking signal; and
a locking signal detection circuit configured to generate the locking signal for correcting the duty cycle of the external clock signal, using an internal clock signal generated in a semiconductor circuit,
wherein the internal clock signal is generated independently of the external clock signal.

2. The duty cycle correction circuit according to claim 1, wherein the external clock signal comprises a single-phase clock signal provided from outside the semiconductor circuit.

3. The duty cycle correction circuit according to claim 1, wherein the internal clock signal comprises differential clock signals.

4. The duty cycle correction circuit according to claim 1, wherein the correction circuit comprises:
   a receiver configured to receive the external clock signal according to a reference voltage;
   an integrator configured to integrate an output signal of the receiver and output an output signal including the integration result;
   a comparator configured to generate a comparison signal by comparing the locking signal and the output signal of the integrator; and
   a duty cycle calibrator configured to calibrate the duty cycle of the external clock signal according to the comparison signal.

5. The duty cycle correction circuit according to claim 1, wherein the locking signal detection circuit is enabled until duty locking is completed after duty locking is started, and disabled after the duty locking is completed.

6. The duty cycle correction circuit according to claim 1, wherein the locking signal detection circuit comprises:
   an oscillator configured to generate internal differential clock signals;
   a buffer configured to buffer the internal differential clock signals and generate output signals including the buffered signals;
   a duty cycle detector configured to generate differential duty detection signals by detecting a duty difference between the output signals of the buffer;
   a duty cycle calibrator configured to calibrate duty cycles of the internal differential clock signals according to the differential duty detection signals; and
   a locking signal detector configured to output a level at which the duty locking of the internal differential clock signals is completed, as the locking signal.

7. The duty cycle correction circuit according to claim 6, wherein the locking signal detector comprises:
   an analog to digital converter configured to generate differential duty detection codes by converting the differential duty detection signals into digital signals;
   a code comparator configured to determine whether the values of the differential duty detection codes coincide with each other, and activate a transmission enable signal; and
   a locking signal transmitter configured to output any one of the differential duty detection signals as the locking signal, when the transmission enable signal is activated.

8. The duty cycle correction circuit according to claim 7, wherein the analog to digital converter comprises:
   a divider resistor configured to generate a plurality of reference voltages by dividing a voltage level between a power supply terminal and a ground terminal through a plurality of resistors;
   a plurality of first comparators configured to generate any one of the differential duty detection codes by comparing any one of the differential duty detection signals to the respective reference voltages; and
   a plurality of second comparators configured to generate the other of the differential duty detection codes by comparing the other of the differential duty detection signals to the respective reference voltages.

9. The duty cycle correction circuit according to claim 7, wherein the code comparator comprises:
   a plurality of logic gates configured to receive the differential duty detection codes by a pair of bits in the same order, and generate output signals by performing a first logic operation on the received signals; and
   an operation logic configured to generate the transmission enable signal by performing a second logic operation on the output signals of the plurality of logic gates.

10. The duty cycle correction circuit according to claim 6, further comprising an enable control circuit configured to enable the locking signal detection circuit until the duty locking is completed after duty calibration is started, and disable the locking signal detection circuit after the duty locking is completed.

11. The duty cycle correction circuit according to claim 10, wherein the enable control circuit performs an OR operation on a calibration end signal and the locking signal.

12. The duty cycle correction circuit according to claim 11, wherein the calibration end signal is generated according to a duty calibration command.

13. The duty cycle correction circuit according to claim 1, wherein the correction circuit comprises:
   a receiver configured to receive the external clock signal according to a reference voltage;
   a repeater configured to retransmit an output signal of the receiver to predetermined circuit components in a semiconductor circuit;
   an integrator configured to integrate an output signal of the repeater and output an output signal including the integration result;
   a comparator configured to generate differential comparison codes by comparing the locking signal and the output signal of the integrator; and
   a first duty cycle calibrator configured to calibrate the duty cycle of the external clock signal according to the differential comparison codes.

14. The duty cycle correction circuit according to claim 13, wherein the first duty cycle calibrator comprises:
   an inverter having an input terminal coupled to the receiver;
   a plurality of pull-up legs coupled between a power supply terminal and the inverter in common, and configured to pull up an output node of the inverter, using drivability varied through legs which are selectively turned on according to the differential comparison codes; and
   a plurality of pull-down legs coupled between a ground terminal and the inverter in common, and configured to pull down the output node of the inverter, using drivability varied through legs which are selectively turned on according to the differential comparison codes.

15. The duty cycle correction circuit according to claim 13, wherein the locking signal detection circuit comprises:
   an oscillator configured to generate internal differential clock signals;
   a buffer configured to buffer the internal differential clock signals and generated output signals including the buffered signals;
   a replica configured to delay the output signals of the buffer by the same delay time as a signal processing delay time of the repeater, and output the delayed signals;
   a duty cycle detector configured to generate differential duty detection codes by detecting a duty difference between the output signals of the replica;

a second duty cycle calibrator configured to calibrate duty cycles of the internal differential clock signals according to the differential duty detection codes; and a locking signal detector configured to output a level at which the duty locking of the internal differential clock signals is completed, as the locking signal.

16. A duty cycle correction circuit comprising:

a repeater configured to retransmit a received external clock signal to predetermined circuit components in a semiconductor circuit;

a comparator configured to generate a comparison signal by comparing a locking signal and the output signal of the repeater;

a first duty cycle calibrator configured to adjust a duty cycle of the external clock signal according to the comparison signal;

an oscillator configured to generate internal differential clock signals;

a replica configured to delay the internal differential clock signals by the same delay time as a signal processing delay time of the repeater, and output signals including the delayed signals;

a duty cycle detector configured to generate differential duty detection signals by detecting a duty difference between the output signals of the replica;

a second duty cycle calibrator configured to calibrate the duty cycles of the internal differential clock signals according to the differential duty detection signals; and a locking signal detector configured to output a level at which the duty locking of the internal differential clock signals is completed, as the locking signal.

17. The duty cycle correction circuit according to claim 16, wherein the duty cycle detector comprises:

an amplifier circuit configured to receive the differential output signals of the replica, and output amplified differential duty detection signals; and an analog to digital converter configured to convert the differential duty detection signals into digital differential duty detection codes.

18. The duty cycle correction circuit according to claim 16, wherein the locking signal detector comprises:

a code comparator configured to determine whether the values of the differential duty detection codes coincide with each other, and activate a transmission enable signal; and a locking signal transmitter configured to output any one of the differential duty detection codes as the locking signal, when the transmission enable signal is activated.

19. The duty cycle correction circuit according to claim 18, wherein the code comparator comprises:

a plurality of logic gates configured to receive the differential duty detection codes by a pair of bits in the same order, and generate output signals by performing a first logic operation on the received signals; and an operation logic configured to generate the transmission enable signal by performing a second logic operation on the output signals of the plurality of logic gates.

20. The duty cycle correction circuit according to claim 16, further comprising an enable control circuit configured to enable the locking signal detection circuit until the duty locking is completed after duty calibration is started, and disable the locking signal detection circuit after the duty locking is completed.

* * * * *